US012770696B2

(12) United States Patent
Zhang et al.

(10) Patent No.: US 12,770,696 B2
(45) Date of Patent: Oct. 20, 2026

(54) SELECTIVE USAGE OF CONCURRENT READ SCANS FOR READ DISTURB SCANNING

(71) Applicant: Micron Technology, Inc., Boise, ID (US)

(72) Inventors: Daniel Danching Zhang, Milpitas, CA (US); John William Slattery, Boulder, CO (US); Dongxiang Liao, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 18/787,082

(22) Filed: Jul. 29, 2024

(65) Prior Publication Data

US 2026/0031158 A1 Jan. 29, 2026

(51) Int. Cl.
*G11C 16/04* (2006.01)
*G11C 16/32* (2006.01)
*G11C 16/34* (2006.01)

(52) U.S. Cl.
CPC .......... *G11C 16/3418* (2013.01); *G11C 16/32* (2013.01); *G11C 16/349* (2013.01)

(58) Field of Classification Search
CPC .... G11C 16/3418; G11C 16/32; G11C 16/349
See application file for complete search history.

(56) References Cited

U.S. PATENT DOCUMENTS 11,488,684 B1 * 11/2022 Sharon ................ G11C 29/021
2016/0147582 A1 5/2016 Karakulak et al.
2021/0181993 A1 6/2021 Cadloni et al.
2021/0240358 A1 * 8/2021 Sharma .............. G11C 11/5621
2021/0279138 A1 9/2021 Lee
2022/0084607 A1 3/2022 Khayat et al.
2022/0413714 A1 12/2022 Hu et al.
2024/0071462 A1 * 2/2024 Xie .................. G11C 11/40626

OTHER PUBLICATIONS

International Search Report and Written Opinion for International Application No. PCT/US2025/039508, mailed Nov. 19, 2025, 10 Pages.

* cited by examiner

*Primary Examiner* — Pho M Luu
(74) *Attorney, Agent, or Firm* — Lowenstein Sandler LLP

(57) ABSTRACT

A system includes a memory device having planes. A processing device is operatively coupled to the memory device. The processing device initiates a background scan in response to receiving host read command(s) directed at one or more pages across the planes. The processing devices determines, based on one or more attribute values indicating a data retention insensitivity of a first page of the one or more pages, that a first scan read operation, with respect to the first page, is allowed to be performed as an independent wordline (iWL) read operation. The processing device, in response to the determining, transmits a first scan read command to cause the memory device to perform the first scan read operation as the iWL read operation.

20 Claims, 6 Drawing Sheets

300A

300B

SELECTIVE USAGE OF CONCURRENT READ SCANS FOR READ DISTURB SCANNING

TECHNICAL FIELD

Embodiments of the disclosure relate generally to memory sub-systems, and more specifically, to selective usage of concurrent read scan for read disturb scanning.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
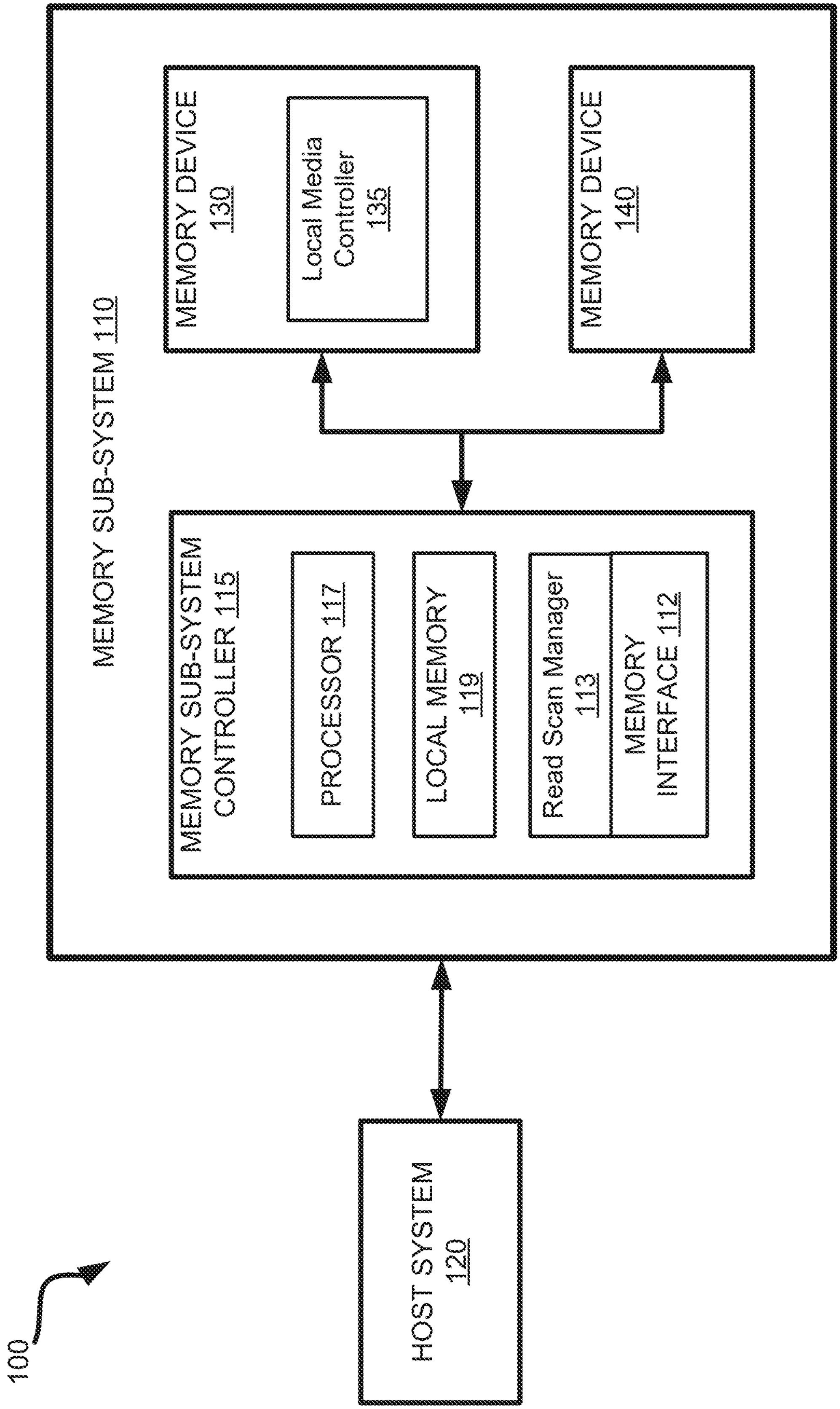
FIG. 1 illustrates an example computing system that includes a memory sub-system in accordance with some embodiments.

Aspects of the present disclosure are directed at selective usage of concurrent read scan for read disturb scanning according to some embodiments. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high-density, non-volatile memory devices where retention of data is desired when no power is supplied to the memory device. For example, NAND memory, such as 3D flash NAND memory, offers storage in the form of compact, high-density configurations. A non-volatile memory device is a package of one or more memory dies, each including one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A data block hereinafter refers to a unit of the memory device used to store data and can include a group of memory cells, a wordline group, a wordline, or individual memory cells. Each data block can include a number of sub-blocks, where each sub-block is defined by a set of associated pillars (e.g., one or more vertical conductive traces) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surround a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

Certain memory storage systems deploy background scans of a memory device to detect data integrity risks caused by stresses such as read disturb or data retention issues of memory cells within the memory device. A read disturb scan, in particular, is performed after some repeated access of particular memory cells in the memory device, e.g., to ensure that nearby or neighboring memory cells have not had voltage states disturbed by reading of the particular memory cells. If the neighboring memory cells, for example, exhibit a high level of bit error rate (BER), the storage system can refresh the data in disturbed memory cells. A read disturb scan is a maintenance operation performed on the memory device to detect and mitigate the effects of read disturb errors. These errors occur due to the repetitive reading of data from the same wordline, which can unintentionally alter the charge levels of cells in nearby wordlines, leading to data corruption.

In this way, the need to perform read disturb scans depends on the number of read operations the host system initiates to access data in a memory device, e.g., by sending read commands to a memory sub-system controller. Read disturb is especially likely to occur when the host system begins to repeatedly access a range of addresses at a die that has not been recently accessed. Further, the higher volume of read operations performed for the host system, the more read disturb instances that can be expected and thus the need for additional read disturb scans. A high input-output (IO) throughput from the host system can result in a high rate of performing read disturb scans at the memory device. In some cases, these memory storage systems cannot keep pace with a desired rate of performing read disturb scans. As a result, a memory subsystem controller may need to throttle host traffic to the memory device, which slows down memory device accesses, negatively impacting quality of service for the host and/or other agents.

As was discussed, certain memory devices of these memory sub-systems include multiple planes of data, where pages of data are accessed across at least some of the multiple planes during any given memory access operation. In these memory sub-systems, read disturb scans are performed as either independent wordline (iWL) read operations or as non-independent wordline (non-iWL) read operations. For example, iWL read operations can be performed via independent driver circuits of a memory device that enables multi-plane reads via different independent wordlines. In contrast, non-iWL read operations can be performed via a common driver circuit that is coupled to multiple wordlines of the memory device, enabling either a read operation at a single plane or a multi-plane read operation along a single wordline shared by multiple planes of the same die. In this way, while iWL read operation enables concurrent read operations at different planes and different independent wordlines, a non-iWL read operation can only be a multi-plane read operation along the same wordline within the same die. A memory subsystem thus can be configured to perform either iWL read operations, non-iWL read operations, or in some cases, both iWL and non-iWL read operations.

In some memory sub-systems, host read operations (to include other agent read operations) are prioritized over performing read disturb scans, where read disturb scans are typically performed in the background, e.g., as a background scan, when a die of the memory device is not busy. For this reason, if a die has too many host read operations queued up, the read disturb scans are either forced to wait until the die has no pending host read operations or forces at least some scan read operations into the read queue, which is expected to increase latency in handling host read commands.

Aspects of the present disclosure address the above and other deficiencies by selectively determining whether a read disturb scan can be performed as an iWL read operation or a non-iWL read operation across planes of a die, and give preference to iWL read operations, where possible. If a scan read operation of the read disturb scan, for example, is allowed to be performed concurrently with performing another scan read operation at another wordline, than these scan read operations can be performed as iWL read operations while other scan read operations are performed as non-iWL read operations.

More specifically, non-iWL read operations have a higher probability of read collisions than iWL read operations due to non-iWL read operations being required to reserve many planes of the die rather than reserving a single plane for a concurrent read operation. In some embodiments, read collisions refer to conflicts that occur when simultaneous read operations are attempted on multiple planes within the same die. This can lead to interference and errors because the shared resources within a typical die, such as wordline drivers and sense amplifiers, are not able to handle multiple read requests at the exact same time. For this reason, it can be preferred to perform iWL read operations to avoid read collisions and increase throughput of read operations, thus avoiding the throttling or delaying of host read operations. The iWL read operations, however, use different read settings that are faster read operations and have less precision compared to non-iWL read operations. Thus, a higher BER is expected, especially in higher voltage valleys of higher voltage states or in association with particular attributes values, which will be discussed. If an iWL read operation is not possible for a particular read scan operation, the read disturb scan can default to a non-iWL read operation for the particular read scan operation.

In some embodiments, the memory sub-system controller (e.g., processing device) of the memory sub-system initiates a read disturb scan in response to detecting one or more host read commands. For example, the one or more host read commands can be directed at one or more pages across the multiple planes. In some embodiments, the controller determines a level of sensitivity to data retention issues of each page targeted for read disturb scanning. In some embodiments, iWL-based scan read operations are avoided at pages where data retention sensitivity is likely (e.g., statistically higher) to cause false bit errors (e.g., at least some bit errors related to other-than-read-disturb causes) and thus likely to obfuscate the results of the read disturb scan results. For example, incorrect results of a read disturb scan can falsely trigger a data refresh operation of a page or block of data, which can incur unnecessary performance hits and additional PE cycles, which can prematurely age the memory device.

In embodiments, data retention sensitivity refers to the degree to which read levels vary or bit error rate (BEC) increases as data stored in memory cells ages. In varying embodiments, data retention sensitivity is based on one or more factors, such as page type, location of a wordline to which the page is coupled, total number of wordlines in a die, a temperature of the die, erase cycle count (e.g., program/erase count) of the page, and block data age, as will be discussed in detail. If the sensitivity to data retention is above some threshold value, for example, the controller can direct performance of a non-iWL read operation with respect to the page. In contrast, if the sensitivity to data retention is equal to or below the threshold value, the controller can direct performance of an iWL read operation with respect to the page.

More specifically, in some embodiments, the controller determines, based on one or more attribute values indicating a data retention insensitivity of a first page of the one or more pages, that a first scan read operation, with respect to the first page, is allowed to be performed as an independent wordline (iWL) read operation. In response to the determination of being allowed to perform a concurrent scan read operation, the controller can transmit a first scan read command to the memory device to cause the memory device to perform the first scan read operation as the iWL read operation. Thus, for example, the first scan read operation can be performed concurrently with performing a second scan read operation, which is also determined to be allowed to be concurrently performed. In embodiments, scan read commands can be either iWL scan read commands or non-iWL scan read commands.

In some embodiments, the controller instead determines, based on one or more attribute values indicating a data retention sensitivity of a first page of the one or more pages, that the first scan read operation, with respect to the first page, is to be performed as an independent wordline (iWL) read operation. In such embodiments, in response to the determination of not being allowed to perform the iWL read operation, the controller transmits, to the memory device, a first scan read command to cause the memory device to perform the first scan read operation as a non-iWL read operation. In some embodiments, the controller also determines a second scan read operation is not allowed to be performed concurrently, and thus is to be performed as a non-iWL read operation, similar to the first scan read operation.

Advantages of the present disclosure include, but are not limited to, enabling a higher throughput of host read commands as well as reducing the latency of pending host read commands as a result of increasing the rate at which scan read operations associated with read disturb scans can be performed. For example, a rate of scan read operations can be increased by performing as many as possible concurrently as iWL read operations. Further, performing host read throughput throttling can be eliminated or at least significantly reduced. Additionally, the memory sub-system can avoid performing unnecessary data refresh along with concomitant performance reduction and memory device aging. Other advantages will be apparent based on the additional details provided herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, the memory sub-system 110 includes a memory interface component 112. Memory interface component 112 is responsible for handling interactions of memory sub-system controller 115 with the memory devices of memory sub-system 110, such as memory device 130. For example, memory interface component 112 can send memory access commands corresponding to requests received from host system 120 to memory device 130, such as program commands, read commands, or other commands. In addition, memory interface component 112 can receive data from memory device 130, such as data retrieved in response to a read command or a confirmation that a program command was successfully performed. In some embodiments, the memory sub-system controller 115 includes at least a portion of the memory interface 112. For example, the memory sub-system controller 115 can include a processor 117 (processing device) configured to execute instructions stored in local memory 119 for performing the operations described herein. In some embodiments, the memory interface component 112 is part of the host system 110, an application, or an operating system.

In one embodiment, the memory sub-system controller 115 includes a memory device read access manager 113 that can, in conjunction with the memory interface 112, oversee, control, and/or manage read access operations, such as read operations and scan read operations, performed on a non-volatile memory device, such as memory device 130, of the memory sub-system 110. In various embodiments, the memory sub-system controller 115 includes at least a portion of the read access manager 113 and is configured to perform the functionality described herein, particularly in relation to determining which pages can be read concurrently as opposed to non-concurrently and issuing a corresponding concurrently or non-concurrent read command, respectively. In such embodiments, the read access manager 113 can be implemented using hardware or as firmware, stored on in the local memory 119 and/or in the memory device 130, executed by the read access manager 113 to perform the operations described herein. In some embodiments, one or more operations performed by the read access manager 113 are performed by the local media controller 135 or other logic located on-board the memory device 130.

Figure 2:
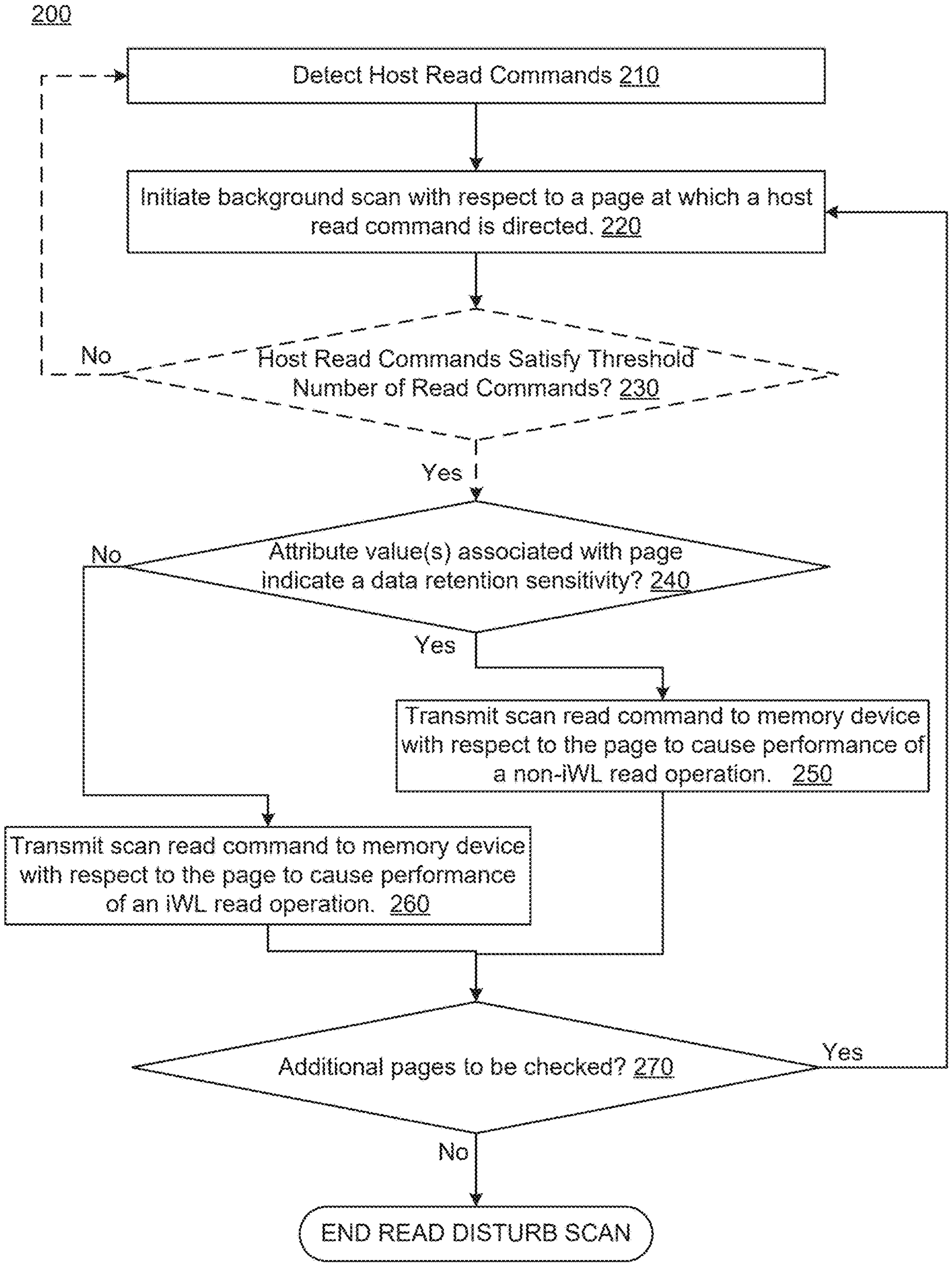
FIG. 2 is a flow diagram of an example method of selectively initiating concurrent read scans for read disturb scanning in accordance with various embodiments.

FIG. 2 is a flow diagram of an example method of selectively initiating concurrent read scans for read disturb scanning in accordance with various embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives host read commands.

At operation 220, the processing logic initiates a read disturb scan with respect to a page at which a host read command is directed. The read disturb scan is with respect to the page because the scan can be performed on nearby or neighboring memory cells to the page that are at risk of being disturbed while performing one or more host read operations at the page.

At operation 230, the processing logic optionally determines whether the detected host read commands satisfy a threshold number of read commands within a particular time period. This optional determination may be performed to check that the throughput of host read commands reaches a particular level that throttling would normally be considered but for the present embodiments that can obviate the need for throttling host read operations. For example, the threshold number of read commands may be a level of read command volume above which would stress the resources and time required to do read disturb scans, such that the host read operations would have to be throttled. If operation 230 is performed and the host read commands do not satisfy the threshold number of read commands, then the processing logic continues to loop back to operation 210. Otherwise, the processing logic proceeds to check of operation 240.

At operation 240, the processing logic determines whether attributes value(s) associated with the page (which is the target of a scan read operation) indicate a data retention sensitivity, e.g., which satisfies a threshold sensitivity value. Data retention sensitivity can be based on one or more factors, such as page type, location of a wordline to which the page is coupled, total number of wordlines across the multiple planes of a die, temperature level of the die, erase cycle count (e.g., program/erase count) of the page, and block data age, as will be discussed in detail. For example, data retention insensitivity will be discussed with reference to FIG. 3A and data retention sensitivity will be discussed with reference to FIG. 3B and FIGS. 4A-4B.

At operation 250, in response to determining that the attribute value(s) indicate data retention sensitivity, the processing logic transmits a first scan read command to the memory device to cause a non-iWL read operation to be performed with respect to the page. For example, the first scan read command can be a non-iWL scan read command and transmitting the first scan read command may cause the memory device to perform the non-iWL read operation.

At operation 260, in response to determining that the attribute value(s) indicate a data retention insensitivity (e.g., fails to satisfy the threshold sensitivity value), the processing logic transmits a second scan read command to the memory device to cause an iWL read operation to be performed with respect to the page. For example, the second scan read command can be an iWL scan read command that is formatted differently than the non-iWL scan read command. Thus, in some embodiments, transmitting the non-iWL scan read to the memory device directs the memory device to instead activate concurrent reading of multiple planes, e.g., via independent driver circuits that was previously discussed. In some embodiments, a number of iWL scan read commands are transmitted to the memory device 130 (which can be sent as a group in one embodiment) that have all been cleared for concurrent read scan operations. In this way, the memory device 130 can handle multiple iWL scan read commands concurrently.

At operation 270, the processing logic determines whether additional pages are to be checked during the read disturb scan. For example, additional pages are those that have been read out as part of one or more host read operations. If there are additional pages, the processing logic can loop back to operation 220 and continue to perform additional iterations of the method 200. Otherwise, the read disturb scan terminates until additional host read commands are received at operation 210.

Figure 3A:
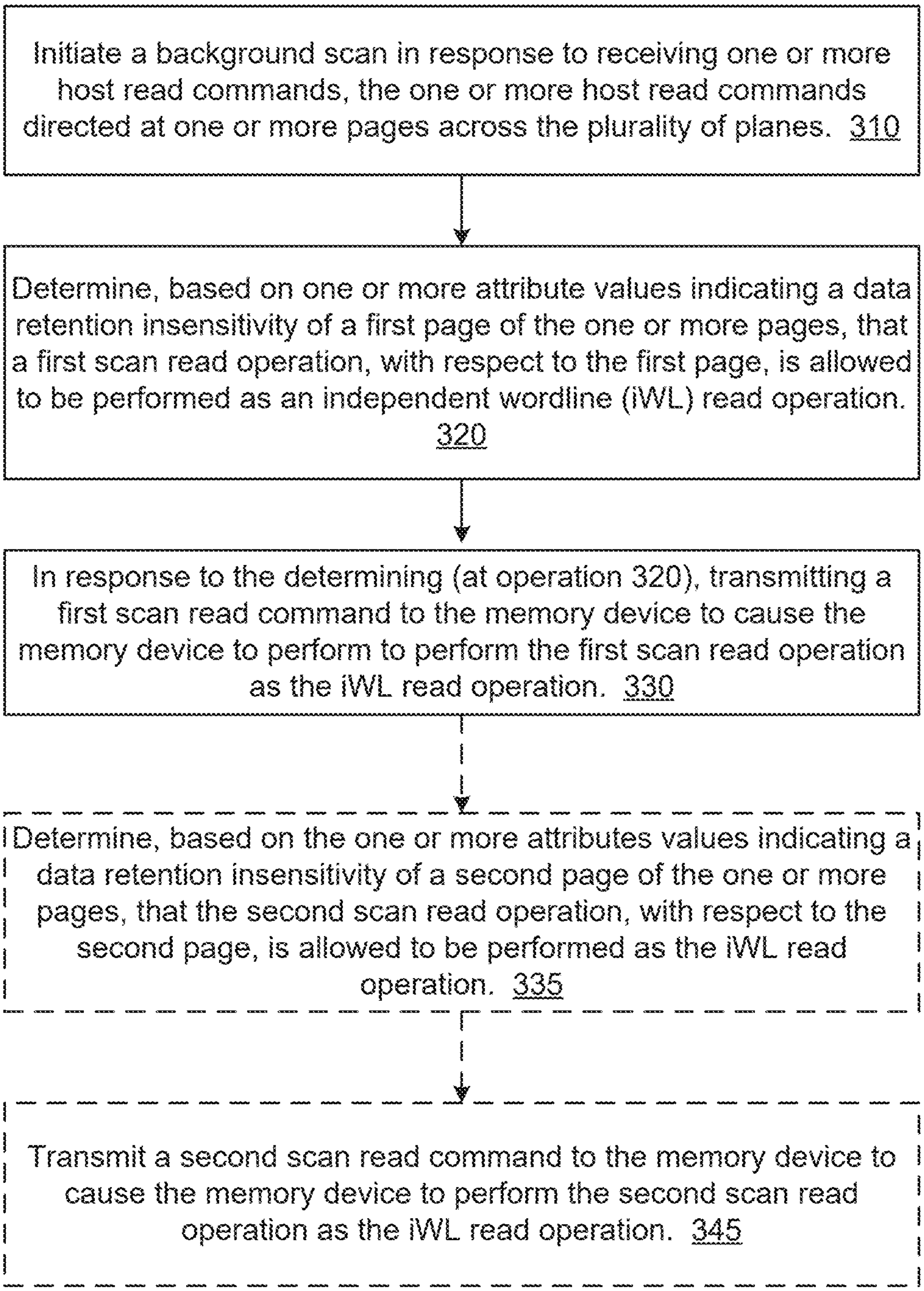
FIG. 3A is a flow diagram of an example method of selectively initiating concurrent read scans for read disturb scanning based on data retention insensitivity in accordance with some embodiments.

FIG. 3A is a flow diagram of an example method 300A of selectively initiating concurrent read scans for read disturb scanning based on data retention insensitivity in accordance with some embodiments. The method 300A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300A is performed by the read access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic initiates a background scan in response to receiving one or more host read commands. In embodiments, the one or more host read commands are directed at one or more pages across the plurality of planes. In some embodiments, the background scan is a read disturb scan.

At operation 320, the processing logic determines, based on one or more attribute values indicating a data retention insensitivity of a first page of the one or more pages, that a first scan read operation, with respect to the first page, is allowed to be performed as an independent wordline (iWL) read operation. A data retention insensitivity can be understood as being associated with a lower risk of BER when data is read out of the first page compared to attribute values being associated with data retention sensitivity. In some embodiments, the determining at operation 320 is performed in response to detecting the one or more host read commands satisfy a threshold number of read commands, as was performed at operation 230 (FIG. 2).

In some embodiments, as part of operation 320, the processing logic further determines the one or more attribute values indicate that a page type of the first page (or of a block or block family to which the first page belongs) is a lower page or an upper page. For example, lower page types in multi-level cells such as MLC, TLC, or QLC tend to exhibit statistically less sensitivity to data retention and thus experience a lower BER for a large majority of read scans. Thus, if the page type is a lower page or an upper page, iWL read operations are allowed.

In some embodiments, as part of operation 320, the processing logic further determines the one or more attribute values indicates that a wordline to which the first page is selectively coupled is not located at a boundary of a deck of a block to which the first page belongs. For example, in 3D NAND memory, a deck is a physical structure into which a block of memory is partitioned in order to get more wordlines into a block of multiple decks in depth. Wordlines located at boundaries of these decks tend to be programmed at a different rates and exhibit a higher sensitivity to data retention. As a corollary, wordlines not located at boundaries of these decks tend to have lower sensitivity (or be insensitive) to data retention issues. While location within a deck is one indicator, other indicators can be associated with weak wordlines that may similarly be employed, such as geometry, structural aspects, among other factors. Thus, if the wordline is not located at deck boundaries, iWL read operations are allowed.

In some embodiments, as part of operation 320, the processing logic determines the one or more attribute values indicate that a temperature of the memory device does not satisfy a threshold temperature value. The die at which the scan read operation is being performed may thus not be so hot as to increase data retention sensitivity. Thus, as temperature increases, the risk of data retention sensitivity also increases and a threshold temperature value can be identified as a transition to unacceptable data retention sensitivity risk. Thus, if the temperature value is below the threshold temperature value, iWL read operations are allowed.

In some embodiments, as part of operation 320, the processing logic determines the one or more attribute values indicate that a program-erase (PE) cycle count of the first page does not satisfy a predetermined PE cycle count value. For example, the PE cycle count can still be sufficiently low as to not increase data retention sensitivity. Thus, as PE cycle count increases, the risk of data retention sensitivity also increases and a predetermined PE cycle count value can be identified as a transition to unacceptable data retention sensitivity risk. Thus, if the PE cycle count is below the PE cycle count value, iWL read operations are allowed.

In some embodiments, as part of operation 320, the processing logic determines the one or more attribute values indicate that a time after program of data in a block containing the first page does not satisfy a predetermined period of time. For example, the time after program (or TAP) can be insufficiently long as to not increase data retention sensitivity. Thus, as TAP increases, the risk of data retention sensitivity also increases and a predetermined TAP value can be identified as a transition to unacceptable data retention sensitivity risk. Thus, if the TAP is below the predetermined period of time, iWL read operations are allowed.

In various embodiments, various combinations of these attributes values can also be combined in different ways, depending on application or device architecture, in order to focus on the most determinative characteristics associated with data retention sensitivity. For example, the processing logic can access a lookup table or other data structure in which is indexed threshold values against particular attributes values. When the processing logic is programmed to analyze particular attributes values, the processing logic can access the lookup table to retrieve the threshold value (for each attribute) against which determined values are to be compared.

At operation 330, the processing logic, in response to the determination at operation 320, transmits a first scan read command to the memory device to cause the memory device to perform the first scan read operation as the iWL read operation.

At operation 335, the processing logic optionally determines, based on the one or more attributes values indicating a data retention insensitivity of a second page of the one or more pages, that a second scan read operation, with respect to the second page, is allowed to be performed as the iWL read operation.

At operation 345, the processing logic transmits a second scan read command to the memory device to cause the memory device to perform the second scan read operation as the iWL read operation.

Figure 3B:
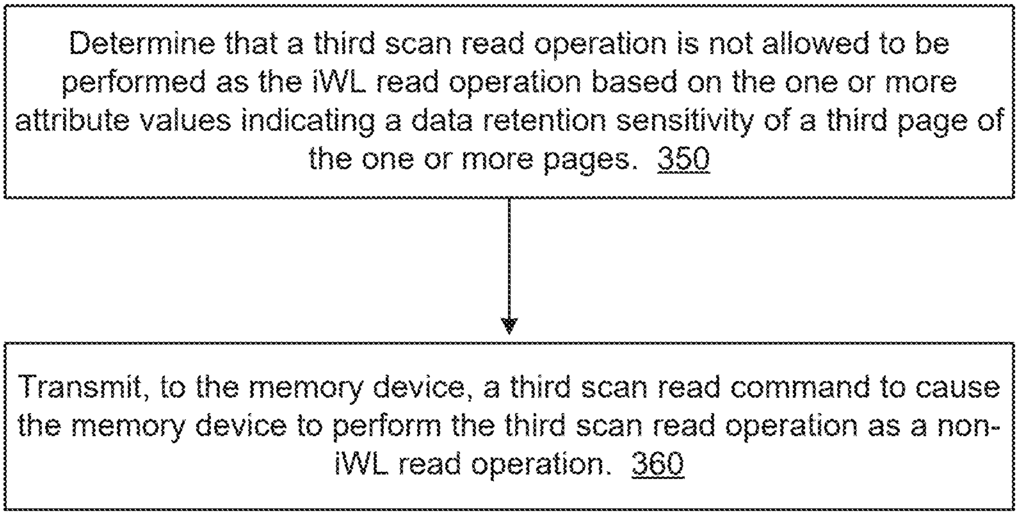
FIG. 3B is a flow diagram of an example method of selectively initiating non-concurrent read scans for read disturb scanning based on data retention sensitivity in accordance with at least one embodiment.

FIG. 3B is a flow diagram of an example method 300B of selectively initiating non-concurrent read scans for read disturb scanning based on data retention sensitivity in accordance with at least one embodiment. The method 300B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300B is performed by the read access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 350, the processing logic determines that a third scan read operation is not allowed to be performed as the iWL read operation based on the one or more attribute values indicating a data retention sensitivity of a third page of the one or more pages. For example, the data retention sensitivity satisfies or at least meets some threshold sensitivity value.

At operation 360, the processing logic transmits, to the memory device, a third scan read command to cause the memory device to perform the third scan read operation as a non-iWL read operation.

Figure 4:
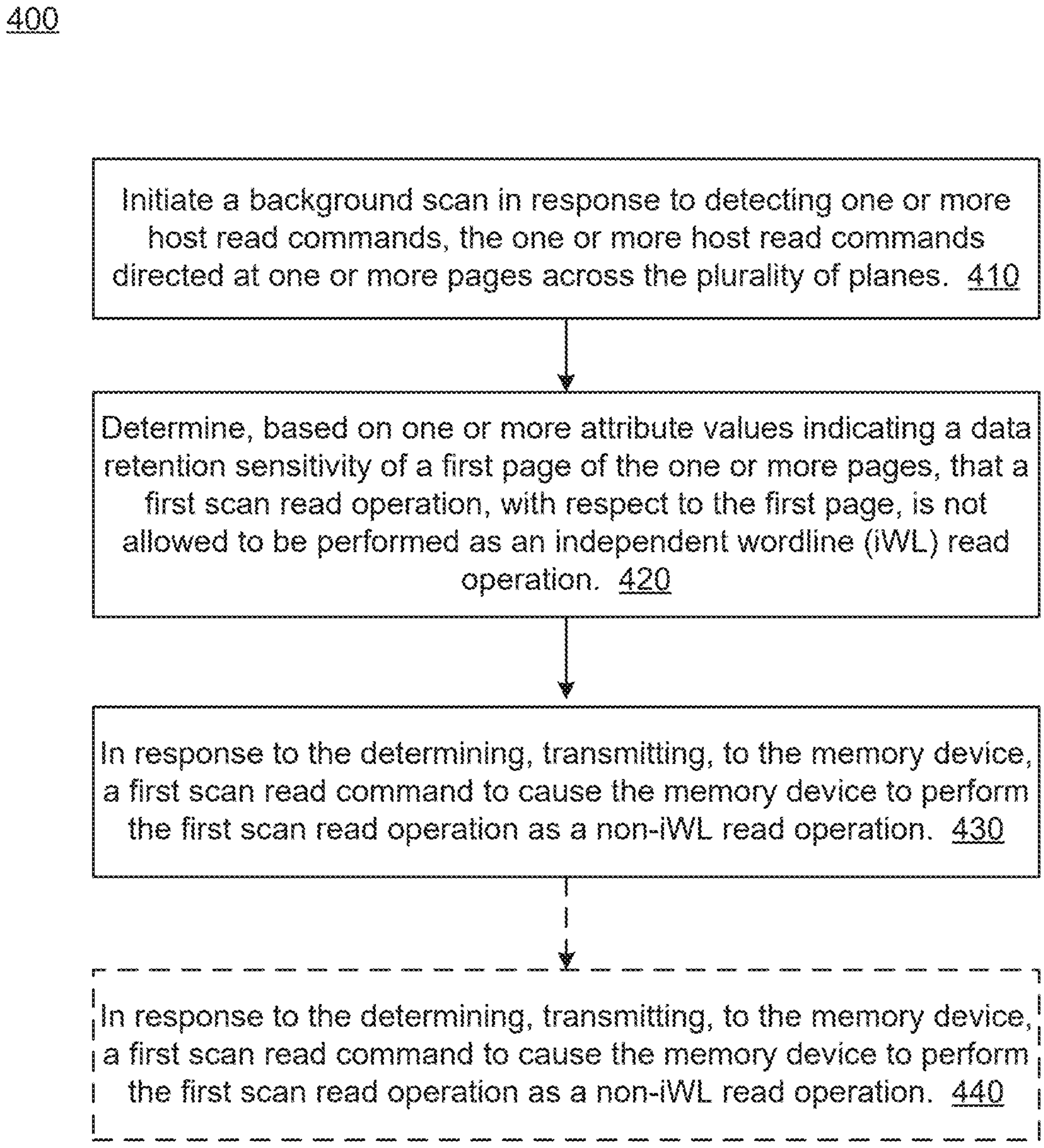
FIG. 4 is a flow diagram of an example method of selectively initiating non-concurrent read scans for read disturb scanning based on data retention sensitivity in accordance with some embodiments.

FIG. 4 is a flow diagram of an example method 400 of selectively initiating non-concurrent read scans for read disturb scanning based on data retention sensitivity in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic initiates a background scan in response to receiving one or more host read commands. In embodiments, the one or more host read commands are directed at one or more pages across the plurality of planes. In some embodiments, the background scan is a read disturb scan.

At operation 420, the processing logic determines, based on one or more attribute values indicating a data retention sensitivity of a first page of the one or more pages, that a first scan read operation, with respect to the first page, is not allowed to be performed as an independent wordline (iWL) read operation. A data retention sensitivity can be understood as being associated with a higher risk of BER when data is read out of the first page compared to attribute values being associated with data retention insensitivity. In some embodiments, the determining at operation 320 is performed in response to detecting the one or more host read commands satisfy a threshold number of read commands, as was performed at operation 230 (FIG. 2).

In some embodiments, as part of operation 420, the processing logic further determines the one or more attribute values indicate that a page type of the first page (or of a block or block family to which the first page belongs) is an extra page (XP). For example, higher page types (e.g., XP) in multi-level cells such as MLC, TLC, or QLC tend to exhibit statistically more sensitivity to data retention and thus experience a higher BER for a large majority of read scans. Thus, if the page type is an extra page, iWL read operations are not allowed.

In some embodiments, as part of operation 420, the processing logic determines the one or more attribute values indicate that a number of wordlines of the plurality of planes of a die satisfy a threshold number of wordlines. For example, in 3D NAND memory, the higher number of wordlines can indicate a wider discrepancy in data retention for a particular read level, and thus read levels can vary more. Thus, in at least some embodiments, having the number of wordlines of the planes on a particular die satisfy a threshold number of wordlines can indicate an increase to an unacceptable data retention sensitivity. Thus, if the wordlines are the same as or greater than the threshold number of wordlines, iWL read operations are not allowed.

In some embodiments, as part of operation 420, the processing logic determines the one or more attribute values indicate that a temperature of the memory device satisfies a threshold temperature value. For example, the die at which the scan read operation is being performed can be hot enough to increase data retention sensitivity. Thus, as temperature increases, the risk of data retention sensitivity also increases and a threshold temperature value can be identified as a transition to unacceptable data retention sensitivity risk. Thus, if the temperature of the memory device is equal to or greater than the threshold temperature value, iWL read operations are not allowed.

In some embodiments, as part of operation 420, the processing logic further determines the one or more attribute values indicate that a program-erase (PE) cycle count of the first page satisfies a predetermined PE cycle count value. For example, the PE cycle count can increase to be sufficiently high as to increase data retention sensitivity. Thus, as PE cycle count increases, the risk of data retention sensitivity also increases and a predetermined PE cycle count value can be identified as a transition to unacceptable data retention sensitivity risk. Thus, if the PE cycle count is greater than or equal to the predetermined PE cycle count value, iWL read operations are not allowed.

In some embodiments, as part of operation 420, the processing logic determining the one or more attribute values indicate that a time after program of data in a block containing the first page satisfies a predetermined period of time. For example, the time after program (or TAP) can be sufficiently long as to increase data retention sensitivity. Thus, as TAP increases, the risk of data retention sensitivity also increases and a predetermined TAP value can be identified as a transition to unacceptable data retention sensitivity risk. Thus, if the TAP is greater than or equal to the predetermined period of time, iWL read operations are not allowed.

In various embodiments, various combinations of these attributes values can also be combined in different ways, depending on application or device architecture, in order to focus on the most determinative characteristics associated with data retention sensitivity. For example, the processing logic can access a lookup table or other data structure in which is indexed threshold values against particular attributes values. When the processing logic is programmed to analyze particular attributes values, the processing logic can access the lookup table to retrieve the threshold value (for each attribute) against which determined values are to be compared.

At operation 430, the processing logic, in response to the determination at operation 420, transmits, to the memory device, a first scan read command to cause the memory device to perform the first scan read operation as a non-iWL read operation.

At operation 440, the processing logic optionally transmits a second scan read command to the memory device to cause the memory device to perform a second scan read operation as a non-iWL read operation. In embodiments, the second scan read operation is with respect to a second page, of the one or more pages, located at the second plane. In at least some embodiments, the processing logic also determines that the second scan read operation needs to be a non-iWL read operation and is thus scheduled to deconflict with performing the first scan read operation.

Figure 5:
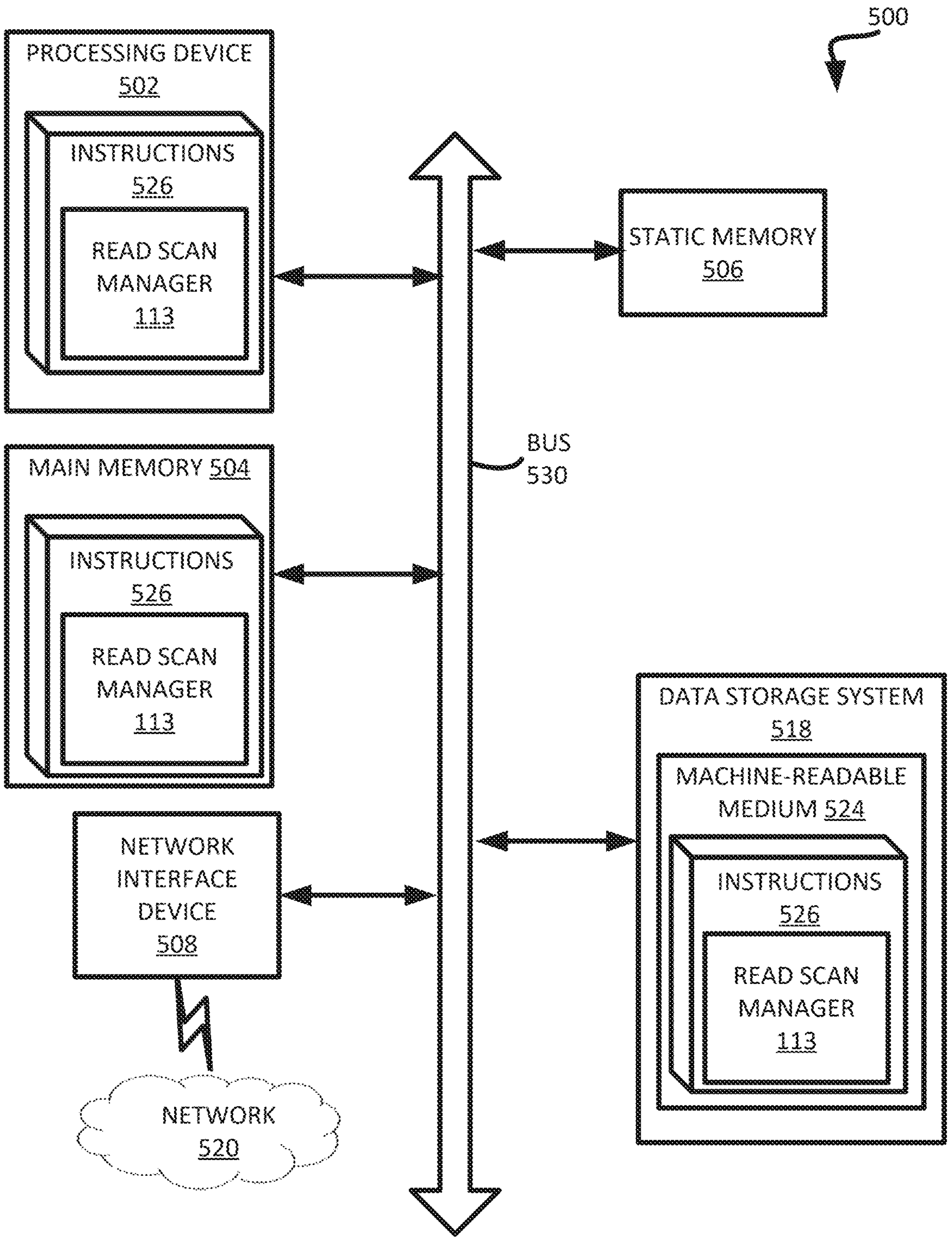
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read access manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium, such as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the read access manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device comprising a plurality of planes; and a processing device operatively coupled to the memory device, the processing device to perform operations comprising:

initiating a background scan in response to receiving one or more host read commands, the one or more host read commands directed at one or more pages across the plurality of planes;

determining, based on one or more attribute values indicating a data retention insensitivity of a first page of the one or more pages, that a first scan read operation, with respect to the first page, is allowed to be performed as an independent wordline (iWL) read operation; and in response to the determining, transmitting a first scan read command to cause the memory device to perform the first scan read operation as the iWL read operation.

2. The system of claim 1, wherein the background scan is a read disturb scan, and wherein the determining is performed in response to detecting the one or more host read commands satisfy a threshold number of read commands within a particular time period.

3. The system of claim 1, wherein the operations further comprise:

determining, based on the one or more attributes values indicating a data retention insensitivity of a second page of the one or more pages, that a second scan read operation, with respect to the second page, is allowed to be performed as the iWL read operation; and transmitting a second scan read command to the memory device to cause the memory device to perform the second scan read operation as the iWL read operation.

4. The system of claim 1, wherein the operations further comprise:

determining that a third scan read operation is not allowed to be performed as the iWL read operation based on the one or more attribute values indicating a data retention sensitivity of a third page of the one or more pages; and transmitting, to the memory device, a third scan read command to cause the memory device to perform the third scan read operation as a non-iWL read operation.

5. The system of claim 1, wherein the operations further comprise determining the one or more attribute values indicate that a page type of the first page is one of a lower page or an upper page.

6. The system of claim 1, wherein the operations further comprise determining the one or more attribute values indicates that a wordline to which the first page is selectively coupled is not located at a boundary of a deck of a block to which the first page belongs.

7. The system of claim 1, wherein the operations further comprise determining the one or more attribute values indicate that a temperature of the memory device does not satisfy a threshold temperature value.

8. The system of claim 1, wherein the operations further comprise determining the one or more attribute values indicate that a program-erase (PE) cycle count of the first page does not satisfy a predetermined PE cycle count value.

9. The system of claim 1, wherein the operations further comprise determining the one or more attribute values indicate that a time after program of data in a block containing the first page does not satisfy a predetermined period of time.

10. A method comprising:

initiating, by a processing device coupled to a memory device comprising a plurality of planes, a background scan in response to receiving one or more host read commands, the one or more host read commands directed at one or more pages across the plurality of planes;

determining, based on one or more attribute values indicating a data retention sensitivity of a first page of the one or more pages, that a first scan read operation, with respect to the first page, is not allowed to be performed as an independent wordline (iWL) read operation; and in response to the determining, transmitting, by the processing device to the memory device, a first scan read command to cause the memory device to perform the first scan read operation as a non-iWL read operation.

11. The method of claim 10, wherein the background scan is a read disturb scan, and wherein the determining is performed in response to detecting the one or more host read commands satisfy a threshold number of read commands within a particular time period.

12. The method of claim 10, further comprising transmitting a second scan read command to the memory device to cause the memory device to perform a second scan read operation as a non-iWL read operation, wherein the second scan read operation is with respect to a second page of the one or more pages.

13. The method of claim 10, further comprising determining the one or more attribute values indicate that a page type of the first page is an extra page.

14. The method of claim 10, further comprising determining the one or more attribute values indicate that a number of wordlines of the plurality of planes of a die satisfy a threshold number of wordlines.

15. The method of claim 10, further comprising determining the one or more attribute values indicate that a temperature of the memory device satisfies a threshold temperature value.

16. The method of claim 10, further comprising determining the one or more attribute values indicate that a program-erase (PE) cycle count of the first page satisfies a predetermined PE cycle count value.

17. The method of claim 10, further comprising determining the one or more attribute values indicate that a time after program of data in a block containing the first page satisfies a predetermined period of time.

18. A non-transitory computer-readable medium that stores instructions, which when executed by a processing device coupled to a memory device, causes the processing device to perform operations comprising:

initiating a background scan in response to receiving one or more host read commands, the one or more host read commands directed at one or more pages across a plurality of planes of the memory device;

determining, based on one or more attribute values indicating a data retention insensitivity of a first page of the one or more pages, that a first scan read operation, with respect to the first page, is allowed to be performed as an independent wordline (iWL) read operation; and in response to the determining, transmitting a first scan read command to cause the memory device to perform the first scan read operation as the iWL read operation.

19. The non-transitory computer-readable medium of claim 18, wherein the background scan is a read disturb scan, and wherein the determining is performed in response to detecting the one or more host read commands satisfy a threshold number of read commands within a particular time period.

20. The non-transitory computer-readable medium of claim 18, where the operations further comprise:

determining, based on the one or more attributes values indicating a data retention insensitivity of a second page of the one or more pages, that a second scan read operation, with respect to the second page, is allowed to be performed as the iWL read operation; and transmitting a second scan read command to the memory device to cause the memory device to perform the second scan read operation as the iWL read operation.

* * * * *